United States Patent
Lim et al.

(10) Patent No.: US 8,339,829 B2
(45) Date of Patent: Dec. 25, 2012

(54) INFORMATION STORAGE DEVICES USING MOVEMENT OF MAGNETIC DOMAIN WALLS AND METHODS OF MANUFACTURING THE SAME

(75) Inventors: Chee-kheng Lim, Yongin-si (KR); Eun-hyoung Cho, Seoul (KR); Sung-hoon Choa, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/064,894

(22) Filed: Apr. 25, 2011

(65) Prior Publication Data

US 2011/0207240 A1    Aug. 25, 2011

Related U.S. Application Data

(62) Division of application No. 11/980,353, filed on Oct. 31, 2007, now Pat. No. 7,957,175.

(30) Foreign Application Priority Data

Dec. 22, 2006 (KR) .................. 10-2006-0133095
Dec. 29, 2006 (KR) .................. 10-2006-0138862
Dec. 29, 2006 (KR) .................. 10-2006-0138866

(51) Int. Cl.
  *G11C 19/00* (2006.01)
(52) U.S. Cl. ............ 365/81; 365/87; 365/130; 365/158; 365/171; 365/173; 977/933; 257/421
(58) Field of Classification Search .................. 365/48, 365/55, 62, 66, 74, 78, 80–93, 100, 130, 365/131, 148, 158, 171–173, 225.5, 243.5; 216/22; 257/421, E21.665; 438/3; 977/933–935
See application file for complete search history.

(56) References Cited

U.S. PATENT DOCUMENTS

| | | | |
|---|---|---|---|
| 5,815,342 A | 9/1998 | Akiyama et al. | |
| 5,870,328 A | 2/1999 | Mohri | |
| 6,482,742 B1 | 11/2002 | Chou | |
| 6,566,872 B1 | 5/2003 | Sugitani | |
| 6,713,195 B2 | 3/2004 | Wang et al. | |
| 6,834,005 B1 * | 12/2004 | Parkin ............... | 365/80 |
| 6,864,042 B1 | 3/2005 | Kuo et al. | |

(Continued)

FOREIGN PATENT DOCUMENTS

GB    1 497 653    1/1978

(Continued)

OTHER PUBLICATIONS

Second Office Action by the Chinese Patent Office dated Jun. 2, 2011 for Chinese Application No. 200710159774.9 with English translation.

(Continued)

*Primary Examiner* — Richard Elms
*Assistant Examiner* — Harry W Byrne
(74) *Attorney, Agent, or Firm* — Harness, Dickey & Pierce, P.L.C.

(57) ABSTRACT

An information storage device using movement of magnetic domain walls includes a writing magnetic layer having a magnetic domain wall. A stack structure is formed on the writing magnetic layer. The stack structure includes a connecting magnetic layer and an information storing magnetic layer stacked sequentially. The information storage device also includes a reader for reading information stored in the information storing magnetic layer.

16 Claims, 13 Drawing Sheets

U.S. PATENT DOCUMENTS

| | | | |
|---|---|---|---|
| 6,898,132 B2 | 5/2005 | Parkin | |
| 6,920,062 B2 | 7/2005 | Parkin | |
| 7,031,178 B2* | 4/2006 | Parkin | 365/80 |
| 7,236,386 B2* | 6/2007 | Parkin | 365/80 |
| 7,586,781 B2 | 9/2009 | Saitoh et al. | |
| 2003/0170995 A1 | 9/2003 | Chou | |
| 2004/0134565 A1 | 7/2004 | Sun et al. | |
| 2004/0251232 A1 | 12/2004 | Chen et al. | |
| 2004/0252538 A1 | 12/2004 | Parkin | |
| 2004/0252539 A1* | 12/2004 | Parkin | 365/80 |
| 2005/0041463 A1 | 2/2005 | Drewes | |
| 2005/0078509 A1* | 4/2005 | Parkin | 365/158 |
| 2005/0078511 A1* | 4/2005 | Parkin | 365/171 |
| 2005/0100830 A1 | 5/2005 | Xu et al. | |
| 2005/0174876 A1 | 8/2005 | Katoh | |
| 2005/0220990 A1 | 10/2005 | Aoyama et al. | |
| 2006/0024529 A1 | 2/2006 | Murakami | |
| 2006/0104110 A1* | 5/2006 | Sun et al. | 365/173 |
| 2006/0120132 A1* | 6/2006 | Parkin | 365/80 |
| 2006/0237808 A1 | 10/2006 | Saito | |
| 2007/0254188 A1 | 11/2007 | Hayakawa et al. | |
| 2008/0075978 A1 | 3/2008 | Weller et al. | |
| 2008/0130355 A1 | 6/2008 | Saitoh et al. | |

FOREIGN PATENT DOCUMENTS

| | | |
|---|---|---|
| JP | 5-267726 | 10/1993 |
| JP | 2005-116022 | 4/2005 |
| WO | WO 2004/077451 | 9/2004 |

OTHER PUBLICATIONS

A. W. Holleitner et al., Pinning a Domain Wall in (Ga,Mn) as with Focused Ion Beam Lithography, Appl. Phys. Lett. 85, 5622 (2004), pp. 1-13.

European Search Report (dated Feb. 26, 2008) for counterpart European Patent Application No. 07123052.8-1233 is provided for the purposes of certification under 37 C.F.R. §§ 1.97(e) and 1.704(d).

Fassbender, J. et al., "Magnetic patterning by means of ion irradiation and implantation," Journal of Magnetism and Magnetic Materials, Elsevier Science Publishers, Amsterdam, NL, vol. 320, No. 3-4. Oct. 25, 2007, pp. 579-596.

Fassbender, J., et al., "Topical Review; Tailoring magnetism by light-ion irradiation; Topical Review" Journal of Physics D. Applied Physics, Institute of Physics Publishing, Bristol, GB, vol. 37, No. 16, Aug. 21, 2004, pp. R179-R196.

Owen, N. et al., "Patterning Magnetic Antidot-Type Arrays by $Ga^+$ Implantation," IEEE Transactions on Magnetics, IEEE Service Center, New York, NY, vol. 38, No. 5, Sep. 2002, pp. 2553-2555.

Terris, B., et al., "Topical Review; Nanofabricated and self-assembled magnetic structures as data storage media; Topical Review" Journal of Physics D. Applied Physics, Institute of Physics Publishing, Bristol, GB, vol. 38, No. 12, Jun. 21, 2005, pp. R199-R222.

Chinese Office Action and English language translation of Chinese Office dated Nov. 27, 2009 for corresponding Application No. 2007101934028.

Chinese Office Action dated Sep. 8, 2010 and English translation thereof.

U.S. Office Action for U.S. Appl. No. 11/980,553 dated Aug. 3, 2010.

U.S. Office Action for U.S. Appl. No. 11/980,455 dated Jun. 24, 2010.

U.S. Office Action for U.S. Appl. No. 11/980,425 dated Mar. 30, 2010.

U.S. Office Action for U.S. Appl. No. 11/980,425 dated Sep. 30, 2009.

U.S. Office Action for U.S. Appl. No. 11/980,425 dated Aug. 5, 2010.

Notice of Allowance for U.S. Appl. No. 11/980,627 dated Aug. 19, 2010.

Chinese Office Action dated Nov. 27, 2009 and English translation thereof.

U.S. Office Action for U.S. Appl. No. 11/980,353 dated Apr. 14, 2010.

Notice of Allowance for U.S. Appl. No. 11/980,353 dated Oct. 15, 2010.

T. Devolder et al., "Magnetization reversal in irradiation-fabricated nanostructures." *Journal of Applied Physics*, vol. 87, No. 12: Jun. 15, 2000 (pp. 8671-8681).

L. Jay Guo, "Recent progress in nanoimprint technology and its applications." *Journal of Physics D: Applied Physics*, vol. 37: 2004 (pp. R123-R141), May 12, 2004.

R. Hyndman et al., "Modification of Co/Pt multilayers by gallium irradiation—Part 1: The effect on structural and magnetic properties." *Journal of Applied Physics*, vol. 90, No. 8: Oct. 15, 2001 (pp. 3843-3849).

* cited by examiner

INFORMATION STORAGE DEVICES USING MOVEMENT OF MAGNETIC DOMAIN WALLS AND METHODS OF MANUFACTURING THE SAME

CROSS-REFERENCE TO RELATED APPLICATIONS

This non-provisional U.S. patent application a divisional of, and claims priority under 35 U.S.C. §120 to, U.S. application Ser. No. 11/980,353 filed Oct. 31, 2007, now U.S. Pat. No. 7,957,175 which claims priority under 35 U.S.C. §119 to Korean Patent Application No. 10-2006-0133095, filed on Dec. 22, 2006, Korean Patent Application No. 10-2006-0138862, filed on Dec. 29, 2006 and Korean Patent Application No. 10-2006-0138866, filed on Dec. 29, 2006 in the Korean Intellectual Property Office, the entire contents of all of which are incorporated herein by reference.

BACKGROUND

Description of the Related Art

A conventional hard disk drive (HDD) is a device capable of reading and writing information by rotating a magnetic recording medium in a disk form and moving a reading/writing head along the magnetic recording medium. Conventional HDDs are non-volatile data storage devices capable of storing 100 gigabytes (GB) or more of data and may be used as main storage devices in computers.

However, conventional HDDs include a relatively large amount of moving mechanical systems. These mechanical systems may malfunction when the HDD is moved and/or suffers a shock impact. As a result, conventional HDDs may have decreased mobility and/or reliability. The mechanical systems may also increase manufacturing complexity, costs of the HDD, power consumption and/or generate noise. For example, as HDD size is reduced, manufacturing complexity and/or costs may increase.

As an alternative to conventional HDDs, a data storage device using principles of magnetic domain walls of a magnetic material may be used. Hereinafter, a magnetic domain of a magnetic material and a magnetic domain wall will be described, and then an information storage device using the movement of the magnetic domain wall will be described.

Magnetic minute regions constituting a magnetic body are referred to as magnetic domains. In a magnetic domain, the direction of the magnetic moment is identical. The size and the magnetization direction of the magnetic domains may be controlled by the property, shape, size of the magnetic material and external energy.

A magnetic domain wall is a boundary between magnetic domains having different magnetization directions, and may be moved by a current or a magnetic field applied to the magnetic material. For example, a plurality of magnetic domains having a given magnetization direction may be formed in a magnetic layer having a given width and thickness, and the magnetic domains and the magnetic domain walls may be moved using a current or a magnetic field having an appropriate intensity.

Applying principles of magnetic domain wall moving in the information storage device, data may be read or written without rotation of reading/writing heads and a recording medium. Conventional information storage device using movement of magnetic domain wall may not include moving mechanical systems, and thus, may have improved mobility, reliability and/or lower power consumption.

SUMMARY

Example embodiments relate to information storage devices, for example, information storage devices using magnetic domain wall movement, and methods of manufacturing the same.

Example embodiments provide information storage devices using magnetic domain wall movement, for example, information storage devices having a structure capable of storing a relatively large amount of data without moving mechanical systems. Example embodiments may have improved mobility and/or reliability. Example embodiments also provide methods of manufacturing information storage devices.

At least one example embodiment of an information storage device using movement of magnetic domain walls may include a writing magnetic layer having a magnetic domain wall. At least one stack structure may include at least one connecting magnetic layer and at least one information storing magnetic layer. The at least one connecting magnetic layer and the at least one information storing magnetic layer may be stacked sequentially. The at least one stack structure may be formed on the writing magnetic layer. A reader may read information stored in the information storing magnetic layer.

According to at least some example embodiments, the writing magnetic layer and the information storing magnetic layer may be in a bar form, and the writing magnetic layer may be perpendicular or parallel to the information storing magnetic layer. A plurality of the stack structures may be formed along the magnetic layer for writing. A plurality of the stack structures may be formed in direction perpendicular to the writing magnetic layer.

According to at least some example embodiments, the lengths of each of the plurality of information storage magnetic layers may be different. For example, the length of the information storing magnetic layer may be tapered toward the writing magnetic layer in the stack structure.

According to at least some example embodiments, the magnetic anisotropic energy of the writing magnetic layer may be about $2 \times 10^3$ to about $10^7$ J/m$^3$, inclusive. The writing magnetic layer may be formed of CoPt, FePt, an alloy thereof or the like. The magnetic anisotropic energy of the connecting magnetic layer may be about 10 to about $10^3$ J/m$^3$, inclusive. The connecting magnetic layer may be formed of one of Ni, Co, NiCo, NiFe, CoFe, CoZrNb, CoZrCr an alloy thereof or the like. The magnetic anisotropic energy of the information storing magnetic layer may be about $2 \times 10^3$ to about $10^7$ J/m$^3$, inclusive. The information storing magnetic layer may be formed of CoPt, FePt, an alloy thereof or the like.

According to at least some example embodiments, the magnetic anisotropic energy of a first region of the information storing magnetic layer contacting the connecting magnetic layer may be less than the magnetic anisotropic energy of a second region of the information storing magnetic layer. A magnetic anisotropic energy (K1) of the first region may be about $0 \leq K1 <$ about $10^7$ J/m$^3$, and a magnetic anisotropic energy (K2) of the second may be about $2 \times 10^3 \leq K2 \leq$ about $10^7$ J/m$^3$. The first region may be doped with impurity ions including, for example, at least one of He$^+$, Ga$^+$ or the like.

According to at least some example embodiments, the reader may be a magnetic resistance sensor formed on the writing magnetic layer or the information storing magnetic layer. The writing magnetic layer may be formed at a center portion or an end portion of the stack structure.

At least one other example embodiment provides a method of manufacturing an information storage device. According to at least this example embodiment, a writing magnetic layer may be formed on a substrate. A first insulating layer may be formed on the substrate to cover the writing magnetic layer. The first insulating layer may be patterned to form a first opening portion exposing the writing magnetic layer. A first connecting magnetic layer and a first information storing magnetic layer may be formed sequentially in the first opening portion.

According to at least some example embodiments, the first opening portion may include a first groove and a second groove. The first groove may be formed in the second groove, and thus, may have a width less than that of the second groove. The first opening portion may be formed using a nano-imprinting method. The first magnetic layer for connecting may be formed in the first groove. The first information storing magnetic layer may be formed in the second groove.

According to at least some example embodiments, after sequentially forming the first connecting magnetic layer and the first information storing magnetic layer in the first opening portion, a second insulating layer may be formed on the first information storing magnetic layer and the first insulating layer. The second insulating layer may be patterned to form a second opening portion exposing the first information storing magnetic layer. A second connecting magnetic layer and a second information storing magnetic layer may be formed sequentially in the second opening portion.

According to at least some example embodiments, the first information storing magnetic layer exposed by the second opening portion may be doped with impurity ions before forming the second connecting magnetic layer and the second information storing magnetic layer. The impurity ions may include at least one of $He^+$, $Ga^+$ or the like. The second opening portion may include a third groove and a fourth groove. The third groove may be formed in the fourth groove and thus may have a width less than that of the fourth groove. The second opening portion may be formed using a nano-imprinting method. The second connecting magnetic layer may be formed in the third groove. The second information storing magnetic layer may be formed in the fourth groove.

According to at least some example embodiments, a magnetic anisotropic energy of a first region of the information storing magnetic layer may be less than a magnetic anisotropic energy of a second region of the information storing magnetic layer. The first region may be in contact with the connecting magnetic layer, and the second region may include the rest of the information storing magnetic layer except the first region.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1A:
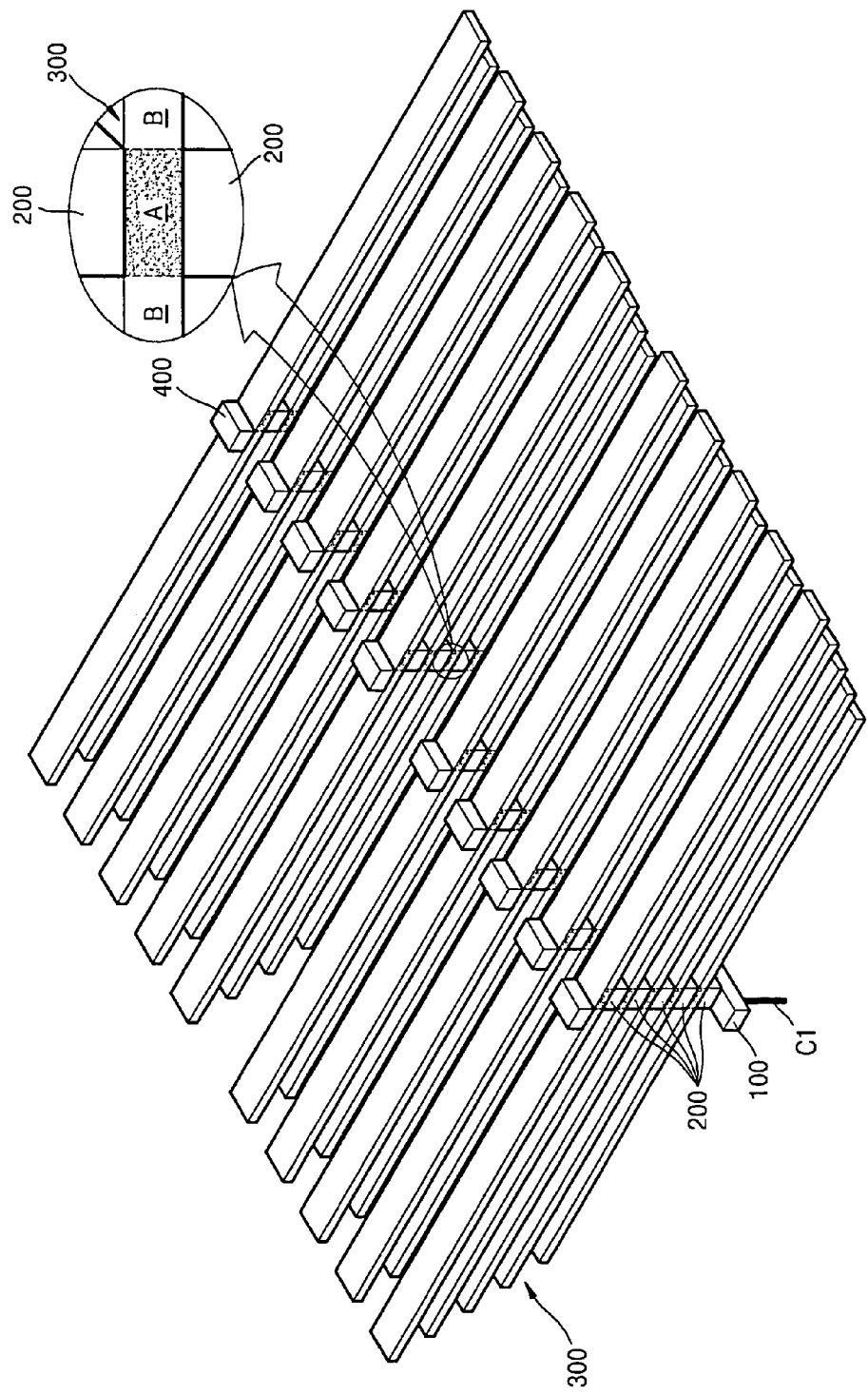
FIGS. 1A and 1B are perspective and side views, respectively, of an information storage device according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1B:
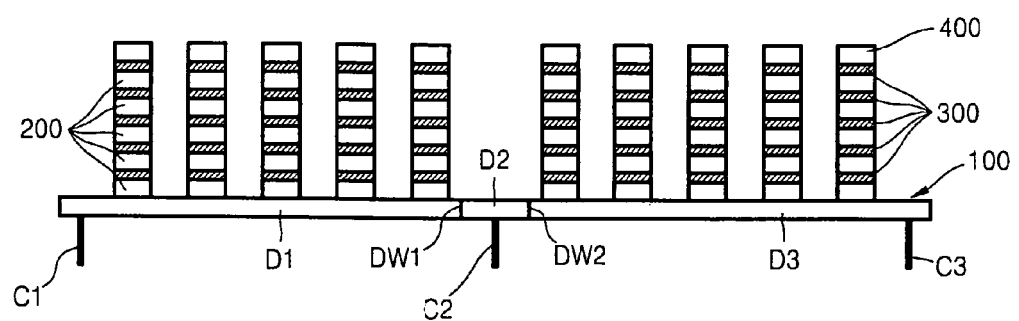

FIGS. 1A and 1B are perspective and side views, respectively, of an information storage device using movement of magnetic domain walls according to an example embodiment (hereinafter, referred to as a first information storage device).

Referring to FIG. 1A, the first information storage device may include a writing magnetic layer 100 and at least one (e.g., a plurality of) information storing magnetic layers 300. The information storing magnetic layers 300 may cross the magnetic layer 100 and may have a multi-layer structure. The writing magnetic layer 100 may be for writing and may have magnetic domain wall movement characteristics. A plurality of connecting magnetic layers 200 for connecting the writing magnetic layer 100 with the information storing magnetic layers 300 may be formed between the writing magnetic layer 100 and the information storing magnetic layers 300 and between each of the information storing magnetic layers 300. A reader 400 for reading information stored in the information storing magnetic layers 300 may be formed on a given region of the information storing magnetic layers 300. The reader 400 may be a magnetic resistance sensor such as a tunnel magneto resistance (TMR) sensor, a giant magneto resistance (GMR) sensor or the like, which are well known. The reader 400 may be formed under the information storing magnetic layers 300. Alternatively, the magneto resistance sensor 400 may be formed on or under the writing magnetic layer 100.

According to at least some example embodiments, the length of the information storing magnetic layers 300 may decrease in a downward direction (e.g., from reader 400 to writing magnetic layer 100), and a conductive line (not shown) to be connected to a driving device (not shown) may be formed under both ends of the information storing magnetic layers 300. In at least one example embodiment, the lengths of the information storing magnetic layers 300 may taper in a downward direction.

The writing magnetic layer 100 may be a ferromagnetic layer formed of CoPt, FePt, an alloy thereof or the like. The magnetic anisotropic energy of the writing magnetic layer 100 may be about $2 \times 10^3$ to about $10^7$ J/m$^3$, inclusive. The connecting magnetic layer 200 may be a soft magnetic layer formed of one of Ni, Co, NiCo, NiFe, CoFe, CoZrNb, CoZrCr, an alloy thereof or the like, and the magnetic anisotropic energy thereof may be about 10 to about $10^3$ J/m$^3$, inclusive. The information storing magnetic layers 300 may include a first region A and second regions B. The first region A may be a region of the information storing magnetic layers 300 contacting the connecting magnetic layer 200. The magnetic anisotropic energy of the first region A may be less than that of second regions B.

Alternatively, according to at least some example embodiments, the information storing magnetic layers 300 may have the same magnetic anisotropic energy throughout. The magnetic anisotropic energy K1 of the first region A may be about $0 \leq K1 \leq$ about $10^7$ J/m$^3$, and the magnetic anisotropic energy K2 of the second region B may be about $2 \times 10^3 \leq K2 \leq$ about $10^7$ J/m$^3$. The information storing magnetic layers 300 may be formed of CoPt, FePt, an alloy of CoPt and FePt or the like. The first region A may be doped with impurity ions such as He$^+$, Ga$^+$ or the like. As the impurity ions are doped in the first region A, the magnetic anisotropic energy of the first region A may become lower than that of the second region B.

Referring to FIG. 1B, the writing magnetic layer 100 may include at least two magnetic domains and at least one magnetic domain wall. For example, the writing magnetic layer 100 may include first through third magnetic domains D1 through D3 and first and second domain walls DW1 and DW2. The first through third magnetic domains D1 through D3 may be formed in the writing magnetic layer 100 in various manners. In one example, a soft magnetic layer may be formed at the center of a ferromagnetic layer and a given external magnetic field may be applied to the ferromagnetic layer and the soft magnetic layer. The external magnetic filed may magnetize the ferromagnetic layer in contact with the soft magnetic layer in a different magnetization direction than that of the ferromagnetic layer at both sides of the soft layer. The first through third magnetic domains D1 through D3 may be formed in any other suitable manner.

Both ends and a center portion of the magnetic layer 100 may be respectively connected to first through third conductive lines C1 through C3 for applying current. The first or second magnetic domain wall DW1 or DW2 may be moved according to the current applied between the first and second conductive lines C1 and C2 or between the second and third conductive lines C2 and C3. For example, when a current is applied from the first conductive line C1 to the second conductive line C2, the first magnetic domain wall DW1 may move toward the first conductive line C1. The direction of the current and the movement direction of the magnetic domain wall may be opposite to each other because the magnetic domain wall moves in the direction of electron movement.

The magnetization direction of the connecting magnetic layer 200 may vary according to the position of the first and second magnetic domain walls DW1 and DW2. For example, the magnetization direction of the magnetic layer 200 may follow the magnetization direction of the writing magnetic layer 100 contacting the connecting magnetic layer 200. This may be because the connecting magnetic layer 200 is a soft magnetic layer having a more easily reversible magnetization direction. When the magnetization direction of the connecting magnetic layer 200 is reversed, the magnetization direction of the first region A may become the same or substantially the same as that of the connecting magnetic layer 200. This may be because the energy state may be more stable when the connecting magnetic layer 200 and the first region A are magnetized in the same magnetization direction than when the magnetization direction is different. Such a reversal in the magnetization may occur in series from the uppermost connecting magnetic layer 200 to the uppermost first region A. When the magnetic anisotropic energy K1 of the first region A is less than the magnetic anisotropic energy K2 of the second region B, the reversal in the magnetization of the first region A may be easier.

When the magnetization direction of the first region A is reversed as desired and the magnetic domain wall is moved by one bit from the first region A to the second region B, data may be stored in the second region B.

Figure 2:
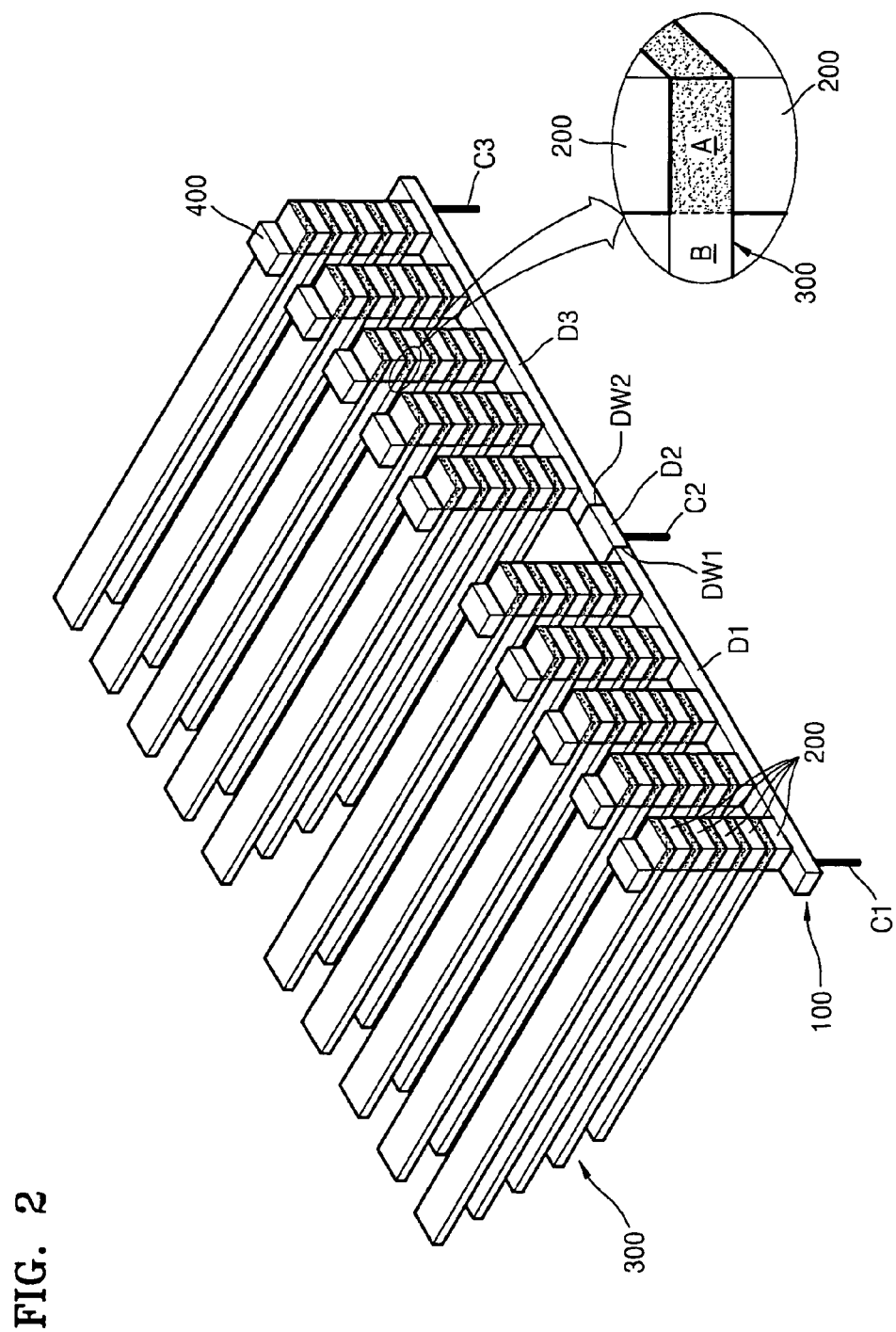
FIG. 2 is a perspective view illustrating an information storage device using movement of magnetic domain walls according to another example embodiment.

FIG. 2 is a perspective view illustrating an information storage device according to another example embodiment (hereinafter referred to as a second information storage device). The second information storage device may be different from the first information storage device illustrated in FIG. 1. The difference there between may be in the information storing magnetic layer 300. The first information storage device may include a second region B at both sides of the first region A, whereas the second information storage device may include a second region B at only one side of a first region A. In the second information storage device, a conductive line (not shown) may be formed under an end of the information storing magnetic layer 300 for applying current.

The writing magnetic layer 100 and the information storing magnetic layer 300 may be formed in parallel. In at least this example embodiment, a plurality of stack structures including the connecting magnetic layer 200 and the information storing magnetic layer 300 may also be stacked on the writing magnetic layer 100, and a plurality of the writing magnetic layers 100 may be arranged more uniformly, having a desired or given interval there between. The interval may be similar or substantially similar to the width of the writing magnetic layer 100.

FIGS. 3A through 3E are perspective views illustrating an example writing operation of the first information storage device of FIG. 1 according to an example embodiment. In FIGS. 3A through 3E, only a portion of the first information storage device is shown for convenience of description.

Figure 3A:
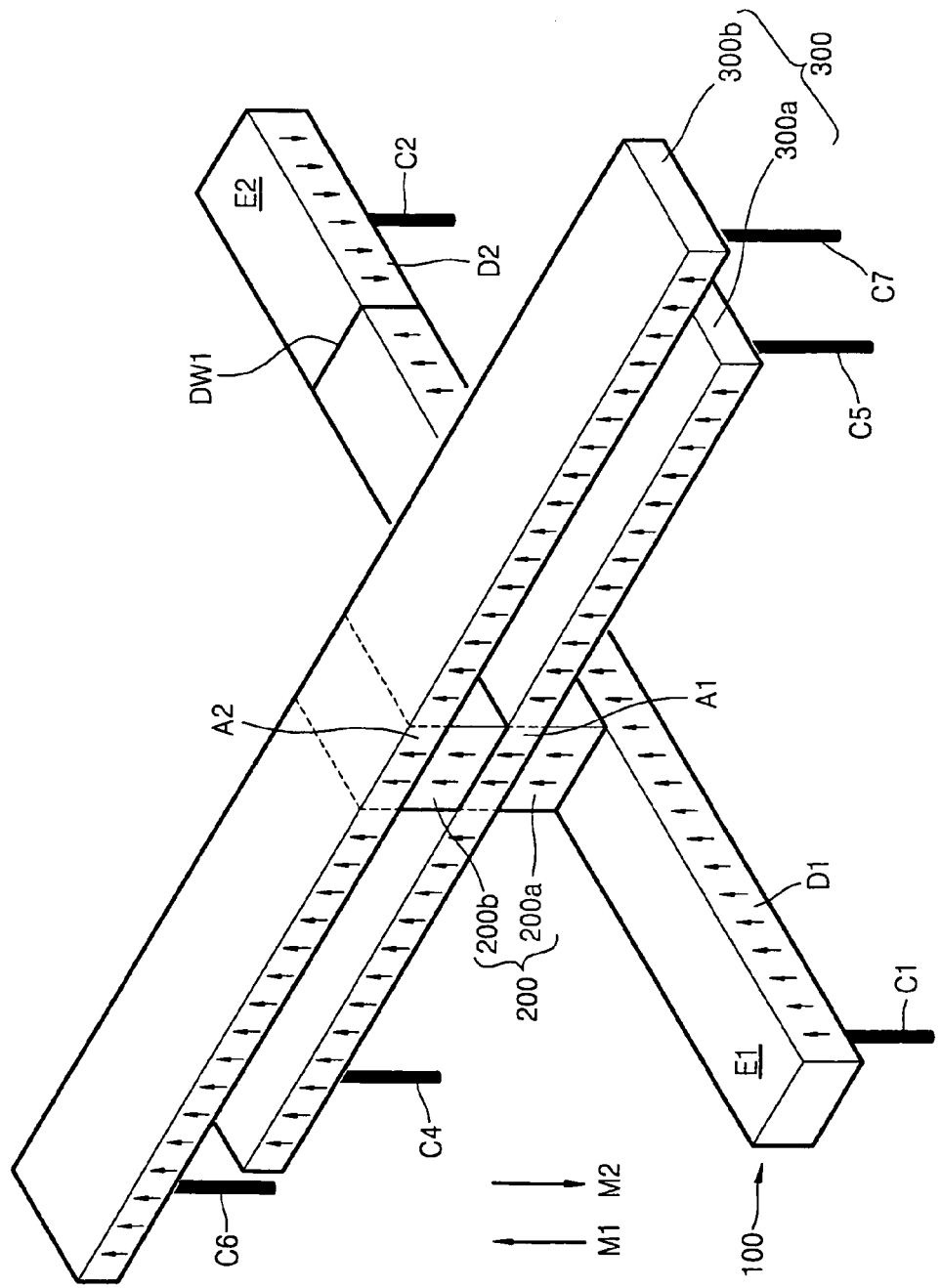
FIGS. 3A through 3E are perspective views illustrating an example writing operation of the information storage device of FIG. 1.

Referring to FIG. 3A, a first magnetic domain D1 of the writing magnetic layer 100, the connecting magnetic layer 200 and the information storing magnetic layer 300 may be magnetized in a first direction M1, and a second magnetic domain D2 of the writing magnetic layer 100 may be magnetized in a second direction D2. In FIG. 3A, the connecting magnetic layer 200 may include first and second connecting magnetic layers 200a and 200b. The information storing magnetic layer 300 may include first and second information storing magnetic layers 300a and 300b. Fourth and fifth conductive lines C4 and C5 may be formed at respective ends of the first magnetic layer 300a and sixth and seventh conductive lines C6 and C7 may be respectively formed at both ends of the magnetic layer 300b. Reference numerals C1 and C2 denote first and second conductive lines respectively formed at a first end E1 and a second end E2 of the writing magnetic layer 100.

Figure 3B:
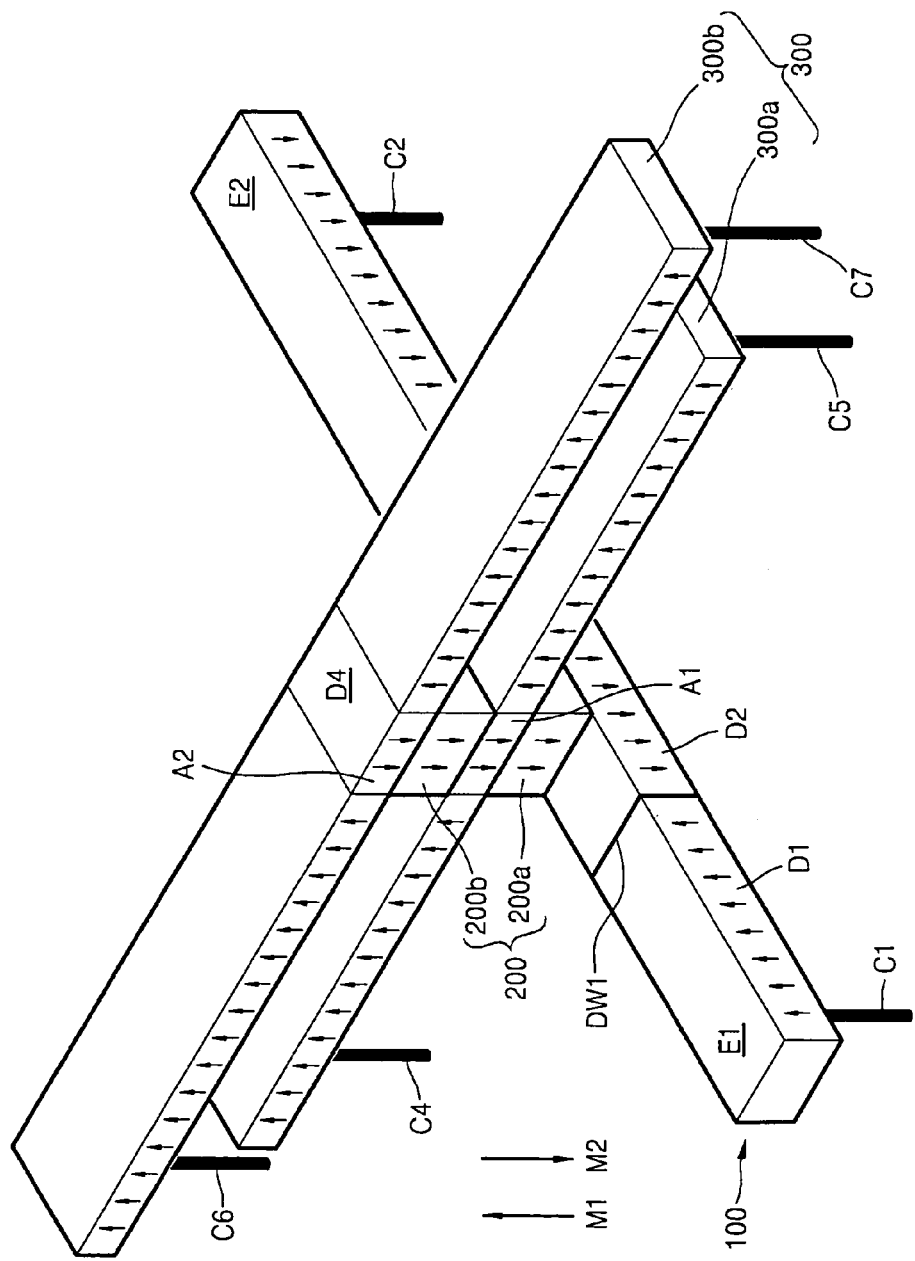

FIG. 3B shows the first information storage device of FIG. 3A in which the first magnetic domain wall DW1 is moved. The first magnetic domain wall DW1 may be moved by applying a current from the first conductive line C1 to the second conductive line C2. Referring to FIG. 3B, the second magnetic domain D2 may extend to the lower portion of the first connecting magnetic layer 200a, and as a result, the magnetization direction of the first connecting magnetic layer 200a may be reversed to a second direction M2. The magnetization direction of a first region A1, contacting the first connecting magnetic layer 200a, may also be reversed to the second direction M2. Such a reversal in magnetization direction may occur in series from the first connecting magnetic layer 200a to a first region A2 of the second information storing magnetic layer 300b. According to the above reversal in magnetization, another magnetic domain, hereinafter a fourth magnetic domain D4, may be formed in the information storing magnetic layer 300.

Figure 3C:
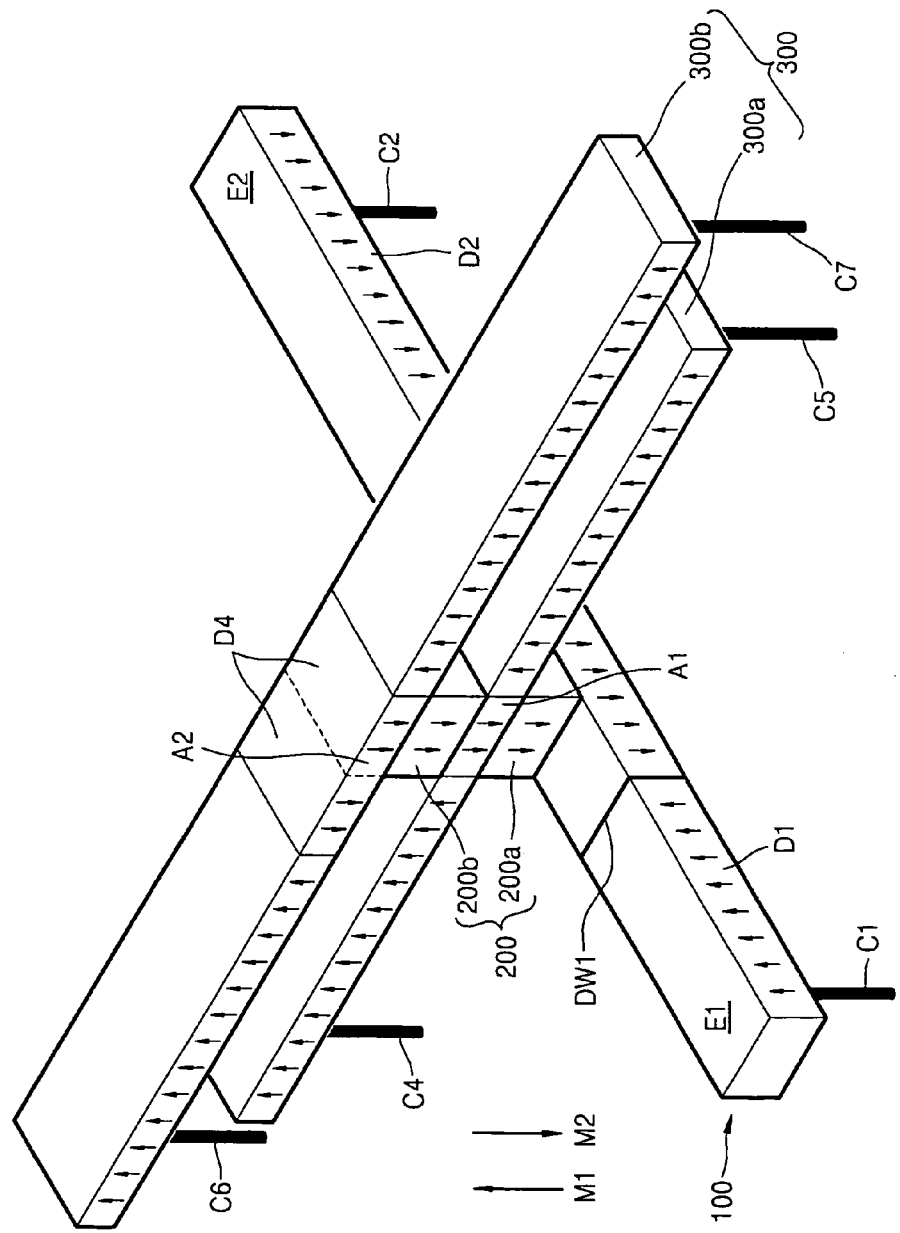

Referring to FIG. 3C, a current may be applied from the sixth conductive line C6 to the second conductive line C2 to extend the fourth magnetic domain D4 in the second information storing magnetic layer 300b toward a first end of the second information storing magnetic layer 300b. Data corresponding to the fourth magnetic domain D4 may be, for example, '0'.

Figure 3D:
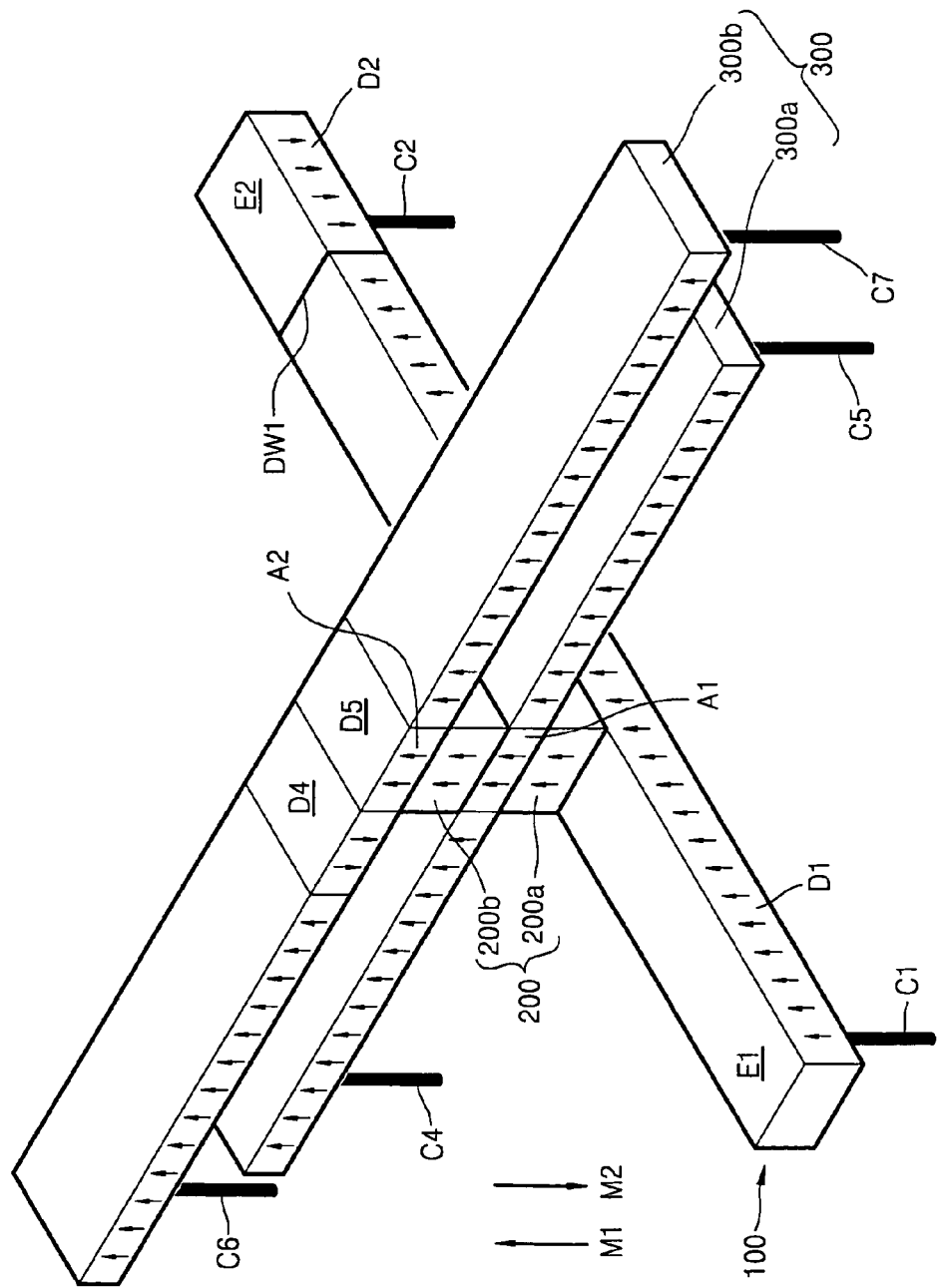

Referring to FIG. 3D, a current may be applied from the second conductive line C2 to the first conductive line C1 to move the first magnetic domain wall DW1 from the first end E1 to the second end E2 of the magnetic layer 100. Thus, the first magnetic domain D1 may extend toward the lower portion of the first connecting magnetic layer 200a. According to at least some example embodiments, the magnetization direction may be reversed to a first direction M1 from the first connecting magnetic layer 200a to the first region A2 of the second connecting magnetic layer 300b. The magnetic domain formed in the first regions A1 and A2 may be referred to as a fifth magnetic domain D5. Data corresponding to the fifth magnetic domain D5 may be, for example, '1'.

Figure 3E:
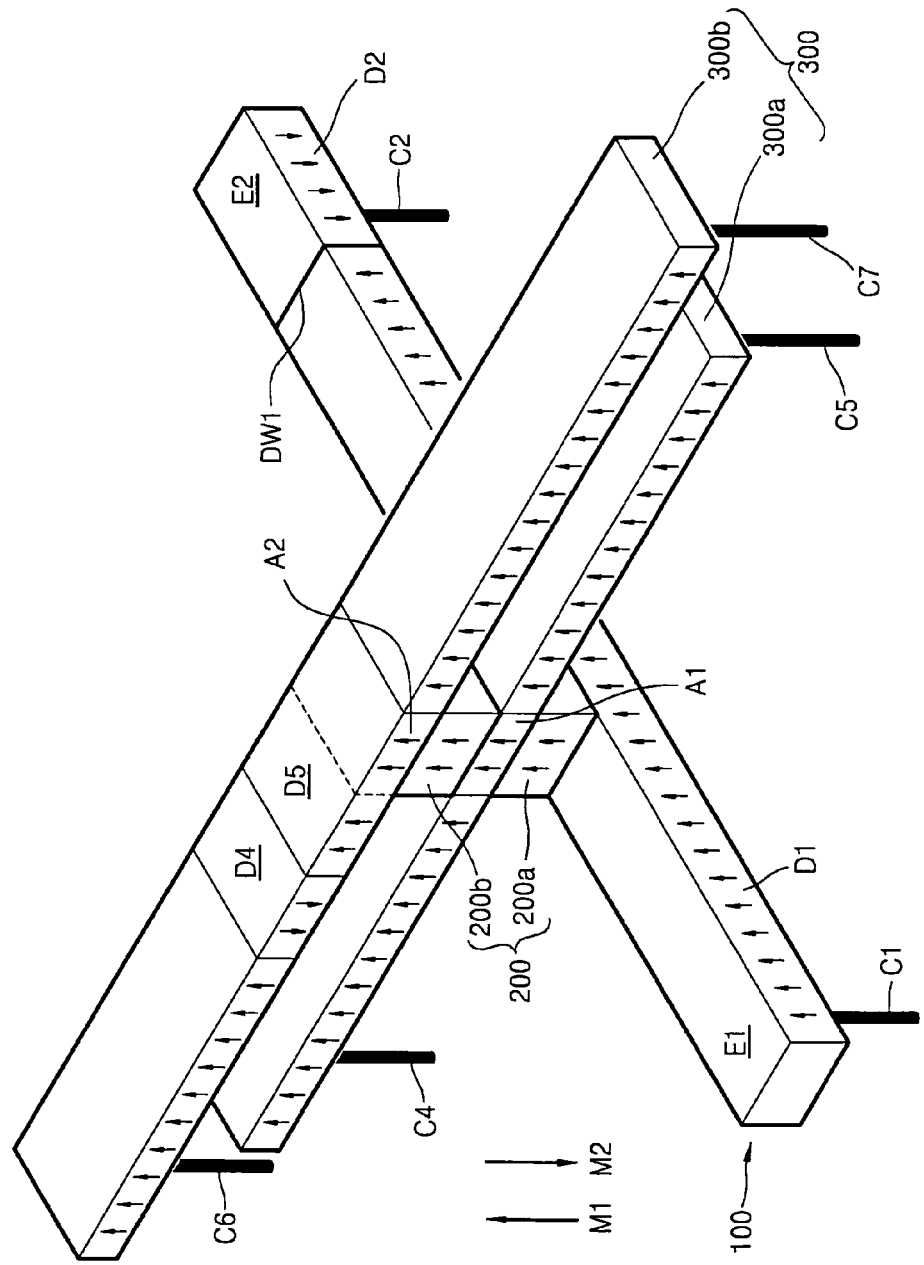

Referring to FIG. 3E, the fourth and fifth magnetic domains D4 and D5 may be moved by one bit toward the first end of the second information storing magnetic layer 300b by applying a current from the sixth conductive line C6 to the first conductive line C1.

Consequently, data corresponding to '0' and '1' may be stored in the second region B of the second information storing magnetic layer 300b. In this way, binary data may be stored in a given or desired region of the information storing magnetic layer 300.

In FIGS. 3A through 3E, the writing magnetic layer 100, the connecting magnetic layer 200 and the information storing magnetic layer 300 may have vertical magnetic anisotropy. However, the above-described example writing method may also be applied to the writing magnetic layer 100, the connecting magnetic layer 200, and the information storing magnetic layer 300 having horizontal magnetic anisotropy.

As described above, in example embodiments of information storage devices, data may be recorded by moving the magnetic domain walls in the writing magnetic layer 100 and the information storing magnetic layer 300. Thus, example embodiments of information storage devices may not require moving mechanical systems. Also, information storage devices may be multi-stack information storage devices as illustrated in FIGS. 1A and 2, and thus may store a relatively large amount of information and/or data.

According to at least some example embodiments, when a magnetic domain in which data is stored is moved to the lower portion of the magnetic resistance sensor 400 and a given reading current is applied to the magnetic resistance sensor 400, data may be read. During the reading and/or writing operations, a portion of the information storing magnetic layer 300 or the writing magnetic layer 100 may be used as a buffer region for temporary storage of data.

Hereinafter, an example embodiment of a method of manufacturing an information storage device using movement of magnetic domain walls will be described.

FIGS. 4A through 4J are cross-sectional views illustrating a method of manufacturing an information storage device according to an example embodiment.

Figure 4A:
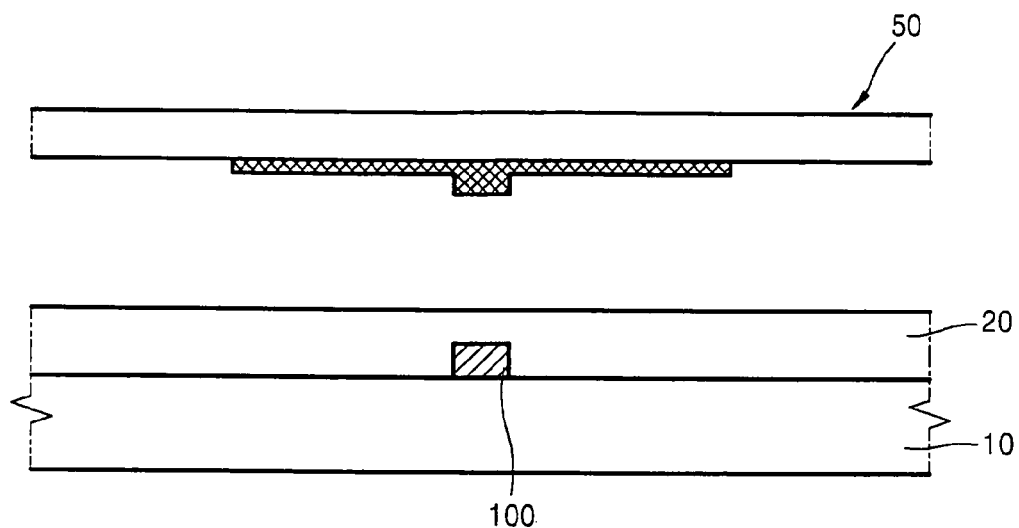
FIGS. 4A through 4J are cross-sectional views illustrating a method of manufacturing an information storage device according to an example embodiment.

Referring to FIG. 4A, a writing magnetic layer 100 may be formed on a substrate 10. The writing magnetic layer 100 in FIG. 4A may correspond to the magnetic layer 100 described with reference to FIG. 1A. A first insulating layer 20 may be formed on the substrate 10 to cover the writing magnetic layer 100. The first insulating layer 20 may be a resin layer or the like.

A first master stamp 50 having a multi-step structure may be arranged above the first insulating layer 20. The first master stamp 50 may be manufactured using a nano-patterning method such as E-beam lithography or the like and may be used repeatedly.

Figure 4B:
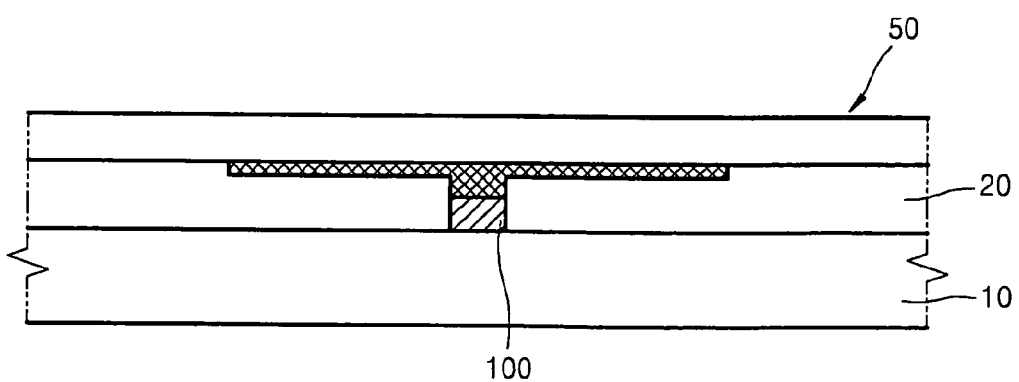

Referring to FIG. 4B, the first insulating layer 20 may be imprinted using the first master stamp 50 to pattern the first insulating layer 20.

Figure 4C:
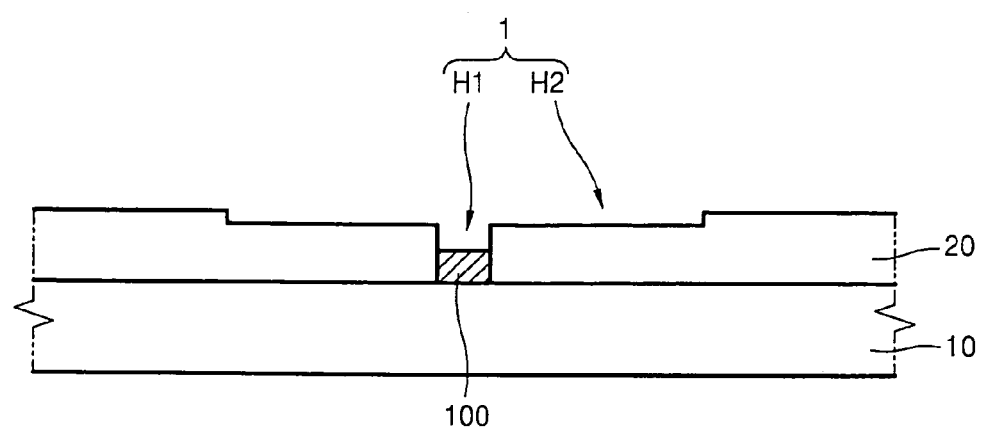

As shown in FIG. 4C, the first master stamp 50 may be removed from the first insulating layer 20. Referring to FIG.

4C, a first opening portion 1 may be formed by an imprinting process using the first master stamp 50. The first opening portion 1 may expose a portion of the writing magnetic layer 100. The first opening portion 1 may include a first groove H1 and a second groove H2. The first groove H1 may be formed in the second groove H2, and thus, the first groove H1 may have a width less than that of the second groove H2. A portion of the first insulating layer 20 may remain on the bottom of the first groove H1, and the remaining portion of the first insulating layer 20 may be removed using reactive ion etching (RIE), plasma ashing or the like.

Figure 4D:
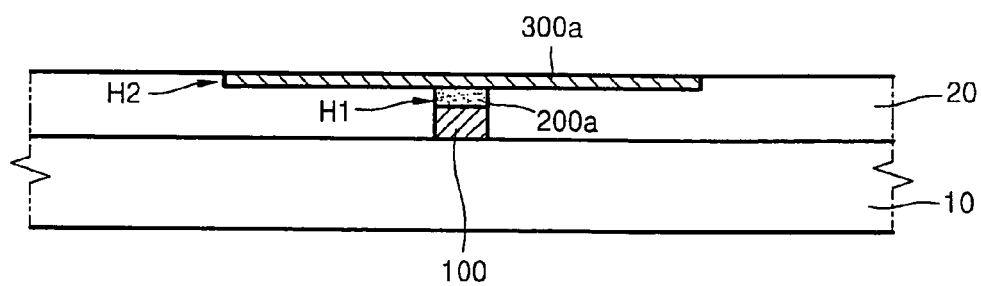

Referring to FIG. 4D, a first connecting magnetic layer 200a may be formed in the first groove H1. The first connecting magnetic layer 200a may correspond to the connecting magnetic layer 200 of FIG. 1A. The first connecting magnetic layer 200a may be formed using an electrolysis plating method or the like. The thickness of the first connecting magnetic layer 200a may be controlled according to reaction conditions and/or reaction time during the electrolysis plating, and thus, the height of the first connecting magnetic layer 200a and the height of the first groove H1 may be adjusted accordingly. Even when the height of the first connecting magnetic layer 200a and the height of the first groove H1 are not the same, subsequent processes may be performed and/or the device may still operate.

A first information storing magnetic layer 300a may be formed in the second groove H2. The first information storing magnetic layer 300a may correspond to the information storing magnetic layer 300 described with regard to FIG. 1A. The first information storing magnetic layer 300a may be formed by depositing a magnetic layer on the first connecting magnetic layer 200a and the first insulating layer 20 using a sputtering method and performing chemical mechanical polishing (CMP) method on the magnetic layer. However, other deposition and polishing methods may be used.

Figure 4E:
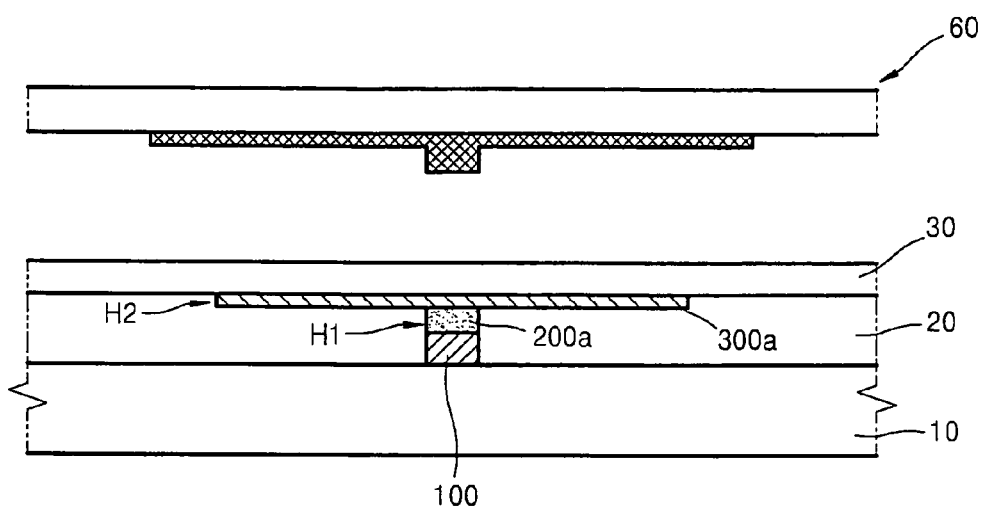

Referring to FIG. 4E, a second insulating layer 30 may be formed on the first information storing magnetic layer 300a and the first insulating layer 20. The second insulating layer 30 may be formed of the same or substantially the same material as the first insulating layer 20. A second master stamp 60 having a multi-step structure may be disposed above the second insulating layer 30.

Figure 4F:
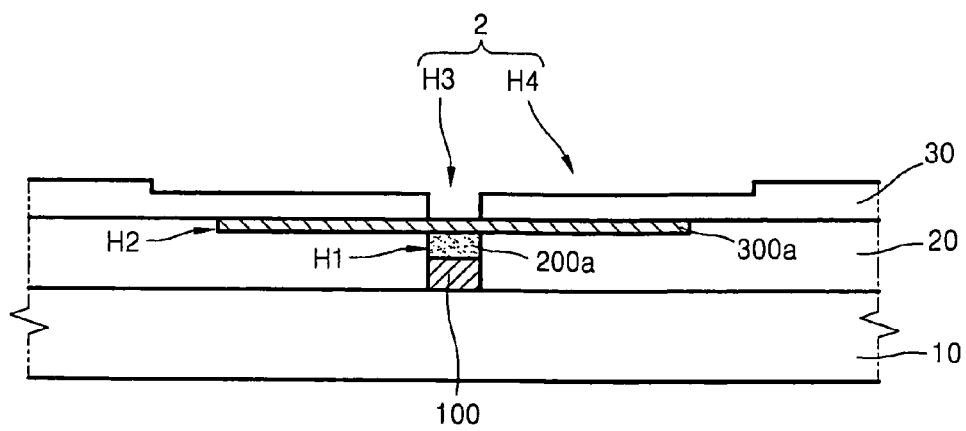

As shown in FIG. 4F, the second insulating layer 30 may be patterned using the second master stamp 60 in a similar or substantially similar manner as the first insulating layer 20 may be patterned using the first master stamp 50. The second master stamp 60 may be removed after patterning. Referring to FIG. 4F, in at least one example embodiment, a second opening portion 2 may be formed by an imprinting method using the second master stamp 60. The second opening portion 2 may expose a portion of the first information storing magnetic layer 300a.

Referring still to FIG. 4F, the second opening portion 2 may include a third groove H3 and a fourth groove H4. The third groove H3 may be formed in the fourth grove H4, and thus, may have a width less than that of the fourth groove H4. The size of the third groove H3 may be the same or substantially the same as the first groove H1 of FIG. 4C, whereas the size of the fourth groove H4 may be greater than the second groove H2 of FIG. 4C.

Figure 4G:
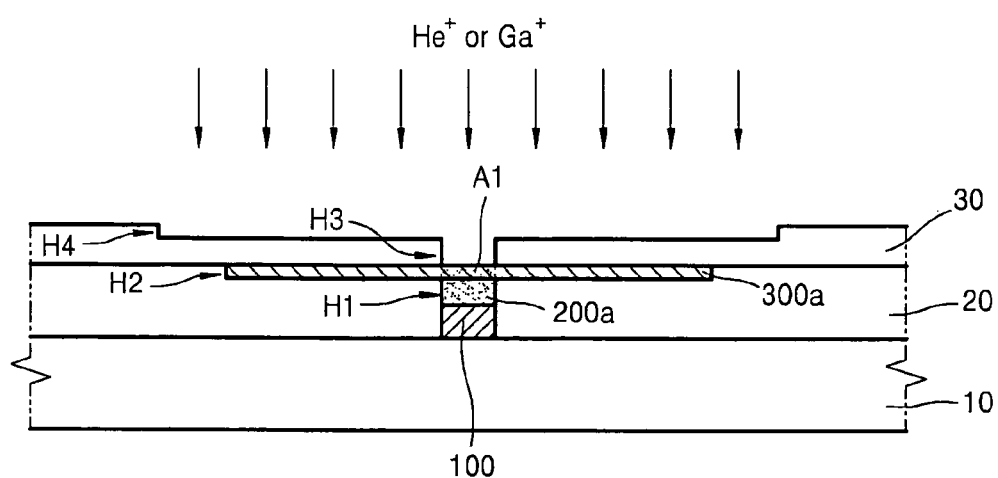

Referring to FIG. 4G, the first information storing magnetic layer 300a exposed by the second opening portion 2 may be doped with impurity ions using the second insulating layer 30 as an ion implantation mask. The impurity ions may be $He^+$, $Ga^+$ or the like. When the magnetic material is doped with $He^+$ and $Ga^+$ impurity ions, the magnetic anisotropic energy of the magnetic material may decrease because the impurity ions reduce the magnetic coupling effect between magnetic particles constituting the magnetic material. The magnetic anisotropic energy of the magnetic material may be reduced to about 0 according to the amount of doping. In FIG. 4G, A1 denotes a portion of the first magnetic layer 300a doped with the impurity ions. In example embodiments, doping with impurity ions is optional.

Figure 4H:
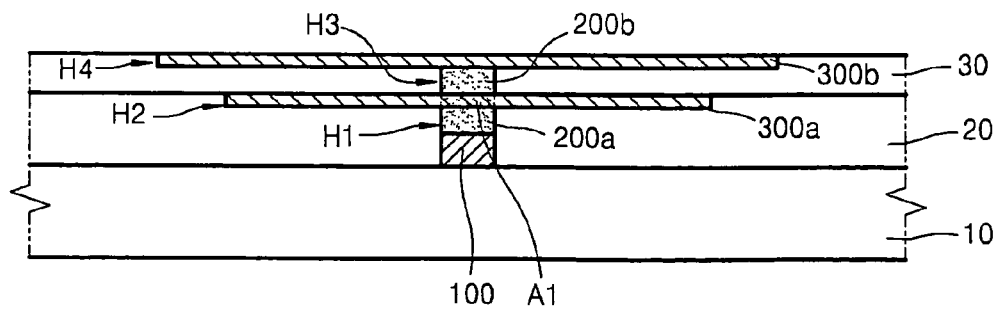

Referring to FIG. 4H, a second connecting magnetic layer 200b and a second information storing magnetic layer 300b may be formed in the second opening portion 2 in the same or substantially the same manner as the first connecting magnetic layer 200a and the first information storing magnetic layer 300a, respectively.

Figure 4I:
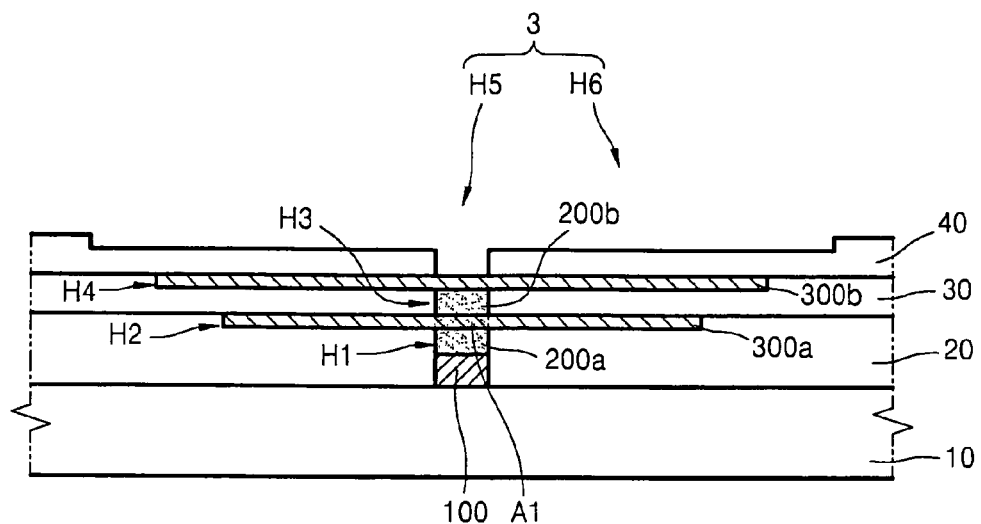

Referring to FIG. 4I, a third insulating layer 40 may be formed on the second information storing magnetic layer 300b and the second insulating layer 30. The third insulating layer 40 may be formed of the same or substantially the same material as the first insulating layer 20. As shown in FIG. 4I, the third insulating layer 40 may be patterned in a similar or substantially similar manner as the first and second insulating layers 20 and 30 may be patterned. Still referring to FIG. 4I, a third opening portion 3 may be formed. The third opening portion 3 may expose a portion of the second information storing magnetic layer 300b. The third opening portion 3 may include a fifth groove H5 and a sixth groove H6. The fifth groove H5 may be formed in the sixth groove H6, and thus, may have a width less than that of the sixth groove H6.

Figure 4J:
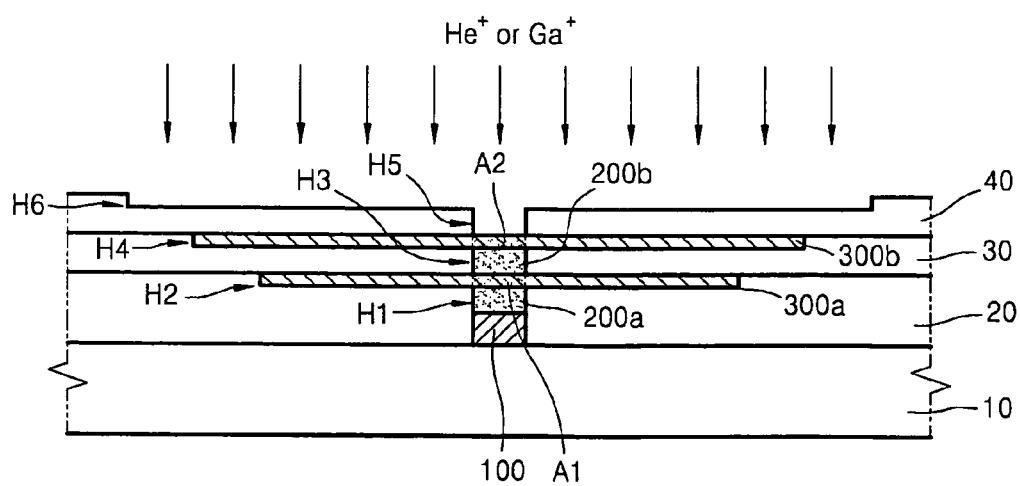

Referring to FIG. 4J, the second information storing magnetic layer 300b exposed by the third opening portion 3 may be doped with impurity ions impurity ions such as $He^+$, $Ga^+$ or the like using the third insulating layer 40 as an ion implantation mask. In FIG. 4J, A2 denotes the portion of the second information storing magnetic layer 300b doped with the impurity ions. In example embodiments, doping with impurity ions is optional.

Although not illustrated in FIG. 4J, a third connecting magnetic layer and a third information storing magnetic layer may be formed in the third opening portion 3 in the same or substantially the same manner as the first connecting magnetic layer 200a and the first information storing magnetic layer 300a, respectively.

Example embodiments of methods of manufacturing the information storage device are discussed herein with regard to the information storage device of FIG. 1A; however, by modifying the form of the first and second master stamps 50 and 60 and the first and second opening portions 1 and 2, the information storage device of FIG. 2 may also be manufactured using a similar or substantially similar method.

According to at least some example embodiments, two grooves may be formed by an imprinting process using a multi-step master stamp. Thus, a relatively large capacity information storage device may be more easily produced using a smaller number of manufacturing steps.

Example embodiments of information storage devices may not include moving mechanical systems, and thus, may have improved mobility, reliability and/or may be capable of storing a relatively large amount of information. Example embodiments of information storage devices may also be more easily produced using a smaller number of manufacturing steps.

While the present invention has been particularly shown and described with reference to example embodiments thereof, the example embodiments should be considered in descriptive sense only and not for purposes of limitation. For example, it will be understood by those skilled in the art that various changes in the positions of the magnetic layer for writing, the magnetic layer for connecting, and the magnetic layer for storing information of the present invention may be made. Therefore, the scope of the invention is defined not by the detailed description of the invention but by the appended claims.

What is claimed is:

1. A method of manufacturing an information storage device, the method comprising:
   forming a writing magnetic layer on a substrate;
   forming a first insulating layer on the substrate, the first insulating layer covering the writing magnetic layer;
   patterning the first insulating layer to form a first opening portion exposing the writing magnetic layer; and
   sequentially forming a first connecting magnetic layer and a first information storing magnetic layer in the first opening portion.

2. The method of claim 1, wherein the first opening portion includes a first groove and a second groove, the first groove being formed in the second groove and the first groove having a width less than that of the second groove.

3. The method of claim 2, wherein the first connecting magnetic layer is formed in the first groove.

4. The method of claim 2, wherein the first information storing magnetic layer is formed in the second groove.

5. The method of claim 1, wherein the first opening portion is formed using a nano-imprinting method.

6. The method of claim 1, further including,
   forming a second insulating layer on the first information storing magnetic layer and the first insulating layer,
   patterning the second insulating layer to form a second opening portion exposing the first information storing magnetic layer, and
   sequentially forming a second connecting magnetic layer and a second information storing magnetic layer in the second opening portion.

7. The method of claim 6, further including,
   doping the first information storing magnetic layer exposed by the second opening portion.

8. The method of claim 7, wherein the first information storing magnetic layer is doped with impurity ions including at least one of $He^+$ and $Ga^+$.

9. The method of claim 6, wherein the second opening portion includes,
   a third groove and a fourth groove, the third groove being formed in the fourth groove and the third groove having a width less than a width of the fourth groove.

10. The method of claim 9, wherein the second connecting magnetic layer is formed in the third groove.

11. The method of claim 9, wherein the second information storing magnetic layer is formed in the fourth groove.

12. The method of claim 6, wherein the second opening portion is formed using a nano-imprinting method.

13. The method of claim 1, wherein the writing magnetic layer has at least one magnetic domain wall.

14. The method of claim 1, wherein the writing magnetic layer has magnetic domain wall movement characteristics.

15. The method of claim 1, wherein the writing magnetic layer is configured to write data to the first information storing magnetic layer.

16. The method of claim 1, wherein the information storage device is a device using movement of magnetic domain walls.

* * * * *